United States Patent
Lin et al.

(10) Patent No.: US 10,096,589 B2
(45) Date of Patent: *Oct. 9, 2018

(54) FIN ESD PROTECTION DIODE AND FABRICATION METHOD THEREOF

(71) Applicant: Taiwan Semiconductor Manufacturing Company, Ltd., Hsin-Chu (TW)

(72) Inventors: Wun-Jie Lin, Hsin-Chu (TW); Bo-Ting Chen, Fengyuan (TW); Jen-Chou Tseng, Jhudong Township (TW); Ming-Hsiang Song, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 349 days.

This patent is subject to a terminal disclaimer.

(21) Appl. No.: 14/796,834

(22) Filed: Jul. 10, 2015

(65) Prior Publication Data
US 2015/0311192 A1    Oct. 29, 2015

Related U.S. Application Data

(62) Division of application No. 13/723,001, filed on Dec. 20, 2012, now Pat. No. 9,117,669.

(51) Int. Cl.
| | |
|---|---|
| H01L 27/02 | (2006.01) |
| H01L 27/24 | (2006.01) |
| H01L 29/66 | (2006.01) |
| H01L 29/861 | (2006.01) |
| H01L 27/06 | (2006.01) |

(52) U.S. Cl.
CPC ...... *H01L 27/0255* (2013.01); *H01L 27/2409* (2013.01); *H01L 29/66136* (2013.01); *H01L 29/861* (2013.01); *H01L 27/0629* (2013.01)

(58) Field of Classification Search
CPC ............. H01L 27/0255; H01L 27/2409; H01L 29/66136; H01L 29/861
See application file for complete search history.

(56) References Cited

U.S. PATENT DOCUMENTS

| | | | |
|---|---|---|---|
| 5,898,193 A | 4/1999 | Ham | |
| 6,297,126 B1 * | 10/2001 | Lim | H01L 21/76232 257/E21.549 |
| 7,795,102 B1 * | 9/2010 | Vashchenko | H01L 27/0255 257/361 |
| 8,779,518 B2 * | 7/2014 | Lin | H01L 27/0255 257/328 |

(Continued)

FOREIGN PATENT DOCUMENTS

| | | | |
|---|---|---|---|
| JP | 2002110811 | | 4/2002 |
| JP | 2002110811 A | * | 4/2002 |

(Continued)

*Primary Examiner* — Marcos D Pizarro
(74) *Attorney, Agent, or Firm* — Slater Matsil, LLP

(57) ABSTRACT

A method comprises forming an active region including a first fin and a second fin over a substrate, wherein the first fin and the second fin are separated by an isolation region, depositing an epitaxial growth block layer over the active region, patterning the epitaxial growth block layer to define a first growth area and a second growth area and growing an N+ region in the first growth area and a P+ region in the second growth area.

20 Claims, 14 Drawing Sheets

(56) References Cited

U.S. PATENT DOCUMENTS

| | | | |
|---|---|---|---|
| 2006/0125014 A1* | 6/2006 | Chong | H01L 27/0255 257/355 |
| 2011/0084362 A1 | 4/2011 | Jalilizeinali et al. | |
| 2013/0292745 A1* | 11/2013 | Liu | H01L 27/0255 257/288 |
| 2014/0131831 A1* | 5/2014 | Wei | H01L 21/77 257/506 |
| 2016/0240675 A1* | 8/2016 | Yu | H01L 21/823807 |

FOREIGN PATENT DOCUMENTS

| | | |
|---|---|---|
| KR | 100222078 B1 | 10/1999 |
| KR | 20110132480 A | 12/2011 |
| WO | 2010115137 A1 | 10/2010 |

* cited by examiner

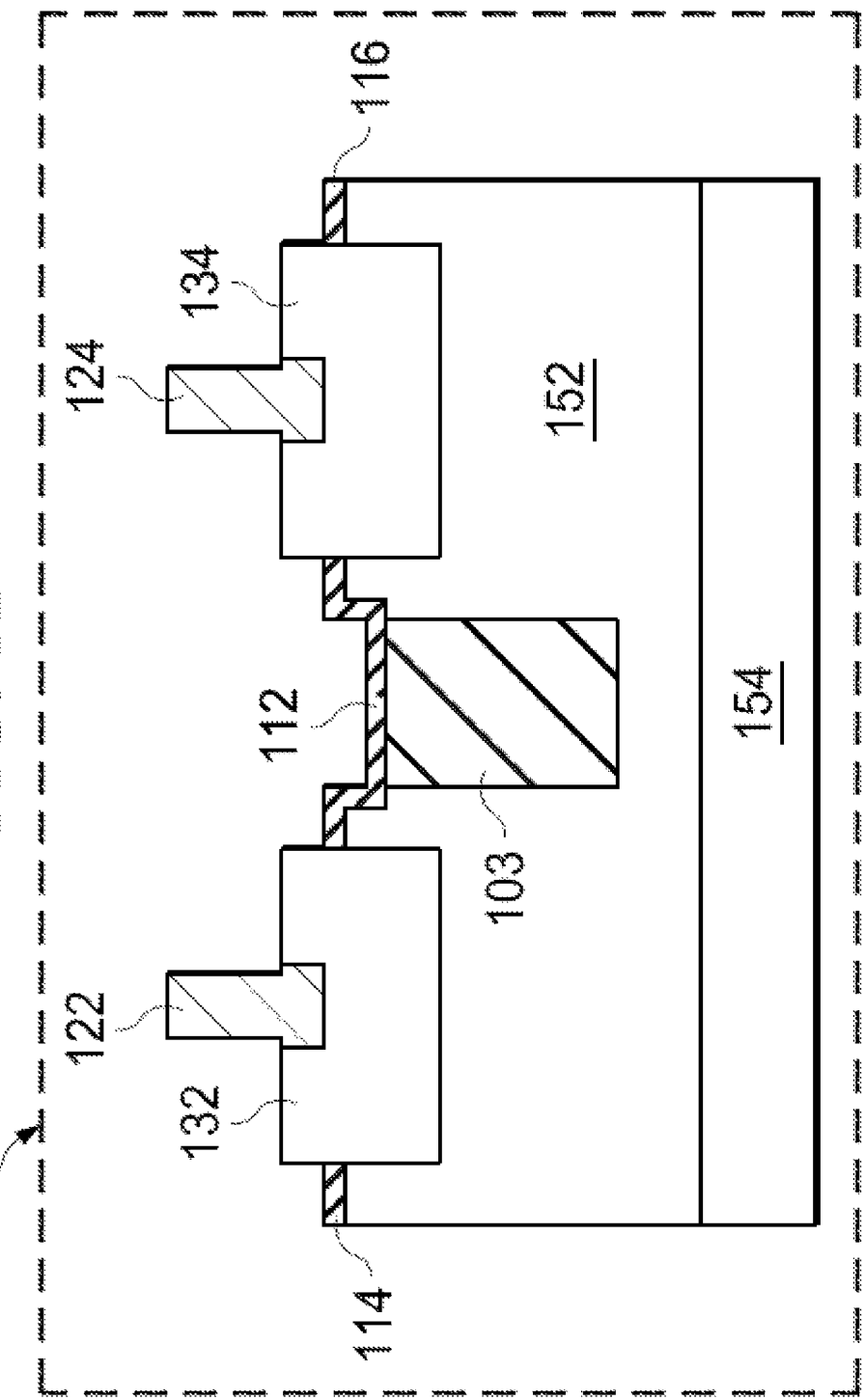

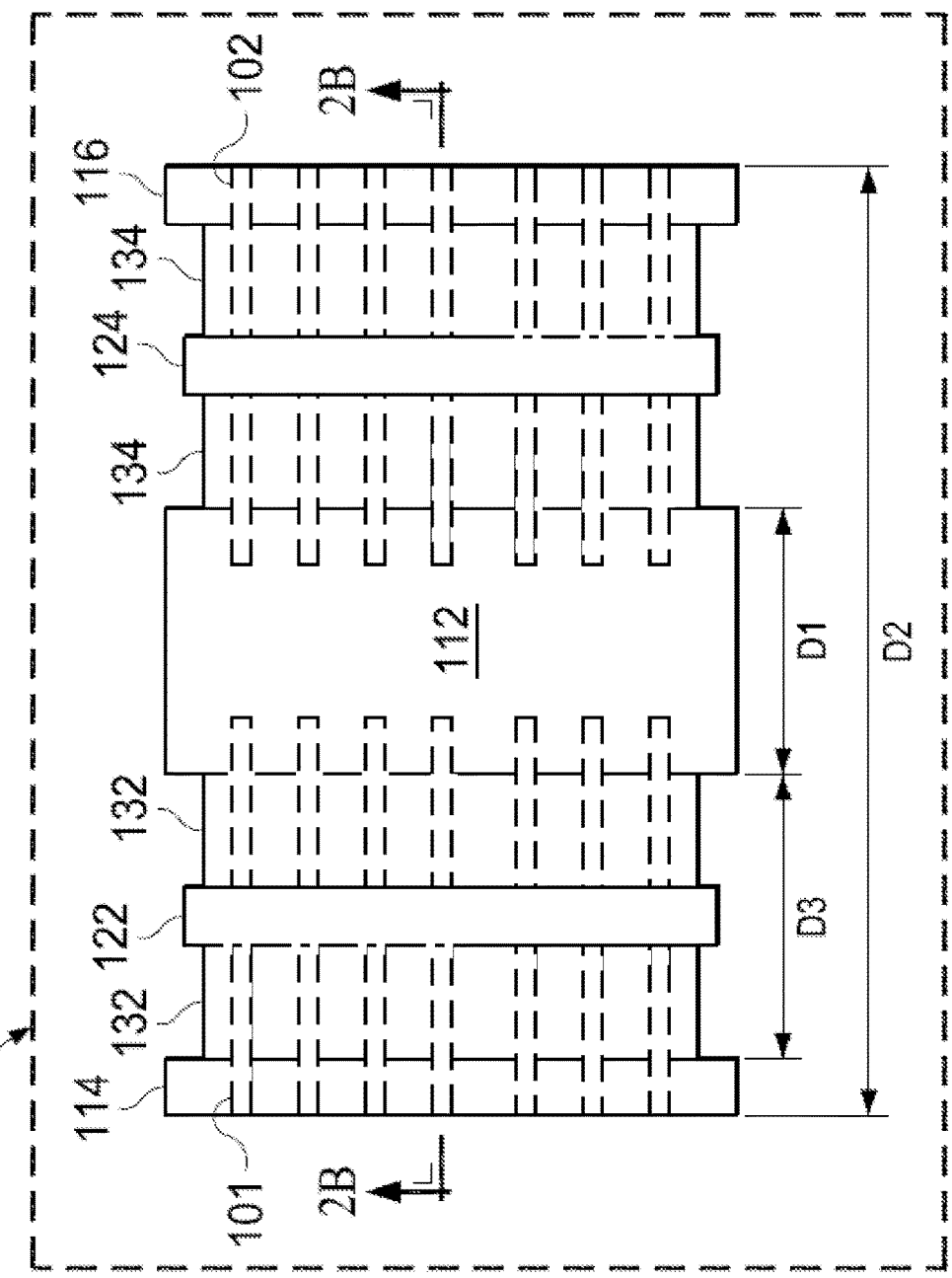

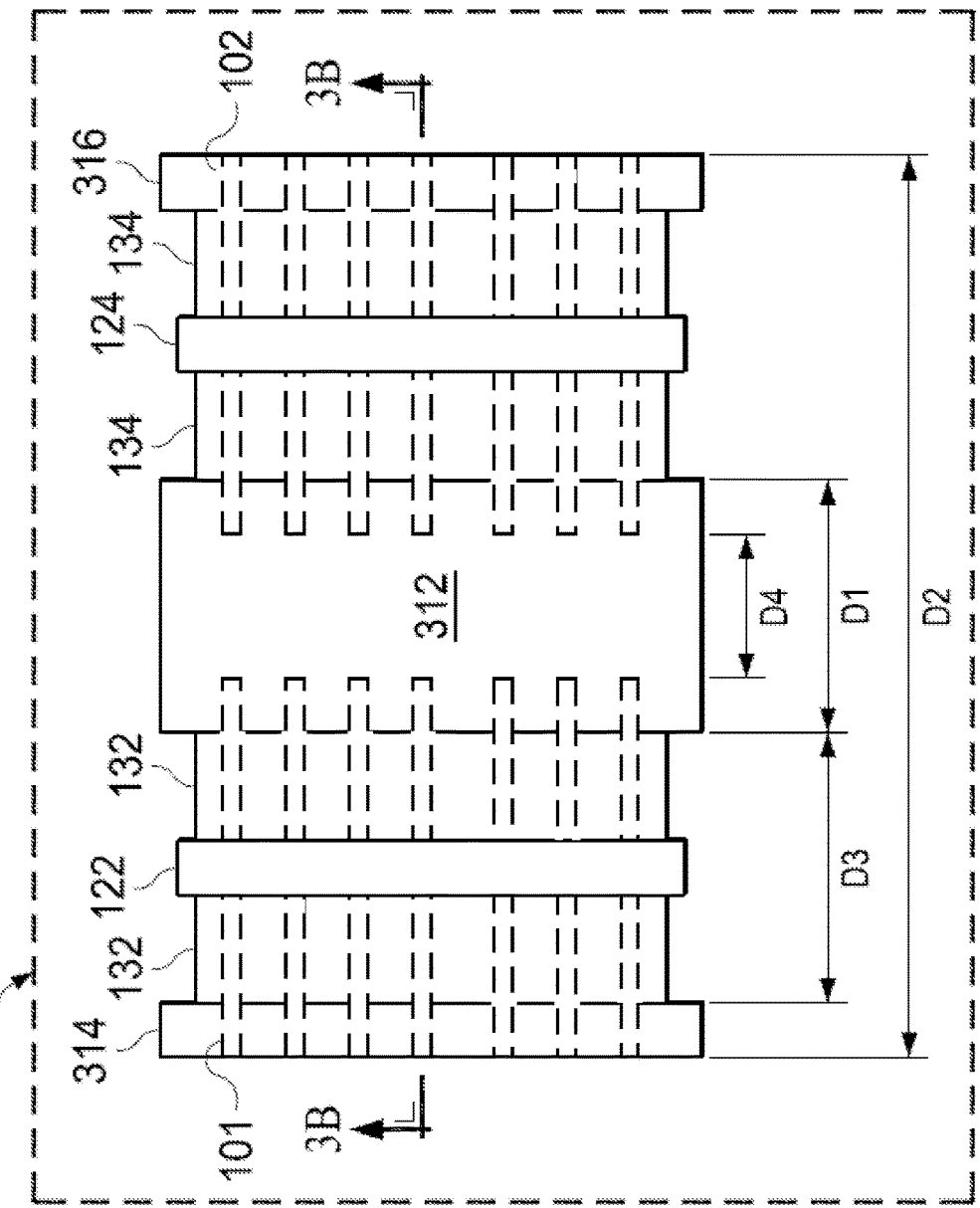

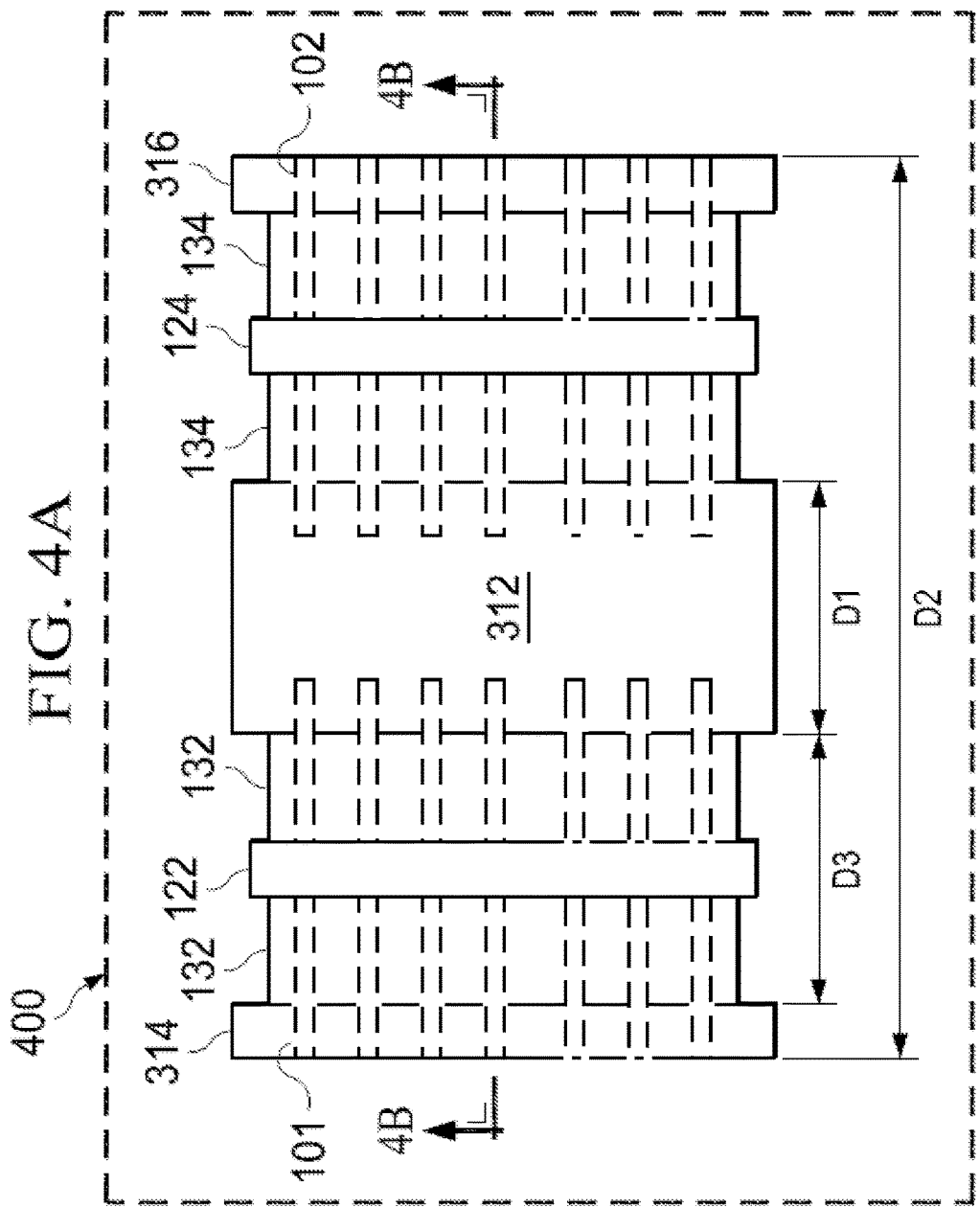

FIN ESD PROTECTION DIODE AND FABRICATION METHOD THEREOF

This application is a divisional of U.S. patent application Ser. No. 13/723,001, entitled "Apparatus for ESD Protection," filed on Dec. 20, 2012, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, may be rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

Semiconductor devices including FinFETs are susceptible to extremely high voltage spikes such as an electrostatic discharge (ESD) transient. ESD is a rapid discharge that flows between two objects due to the built-up of static charge. ESD may destroy semiconductor devices because the rapid discharge can produce a relatively large current. ESD protection structures are needed for integrated circuits. In ESD protection, an ESD circuit is formed near integrated circuit terminals such as input and output pads, and also for power supply terminals. ESD protection circuits may provide a current discharge path so as to reduce the semiconductor failures due to ESD.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1B illustrates a cross sectional view of the n-type ESD protection diode shown in FIG. 1A in accordance with various embodiments of the present disclosure;

FIG. 2A illustrates a top view of a p-type ESD protection diode in accordance with various embodiments of the present disclosure;

FIG. 3A illustrates a top view of another n-type ESD protection diode in accordance with various embodiments of the present disclosure;

FIG. 4A illustrates a top view of another p-type ESD protection diode in accordance with various embodiments of the present disclosure;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely an electrostatic discharge (ESD) protection diode for FinFET applications. The embodiments of the disclosure may also be applied, however, to a variety of ESD protection applications. Hereinafter, various embodiments will be explained in detail with reference to the accompanying drawings.

Figure 1A:
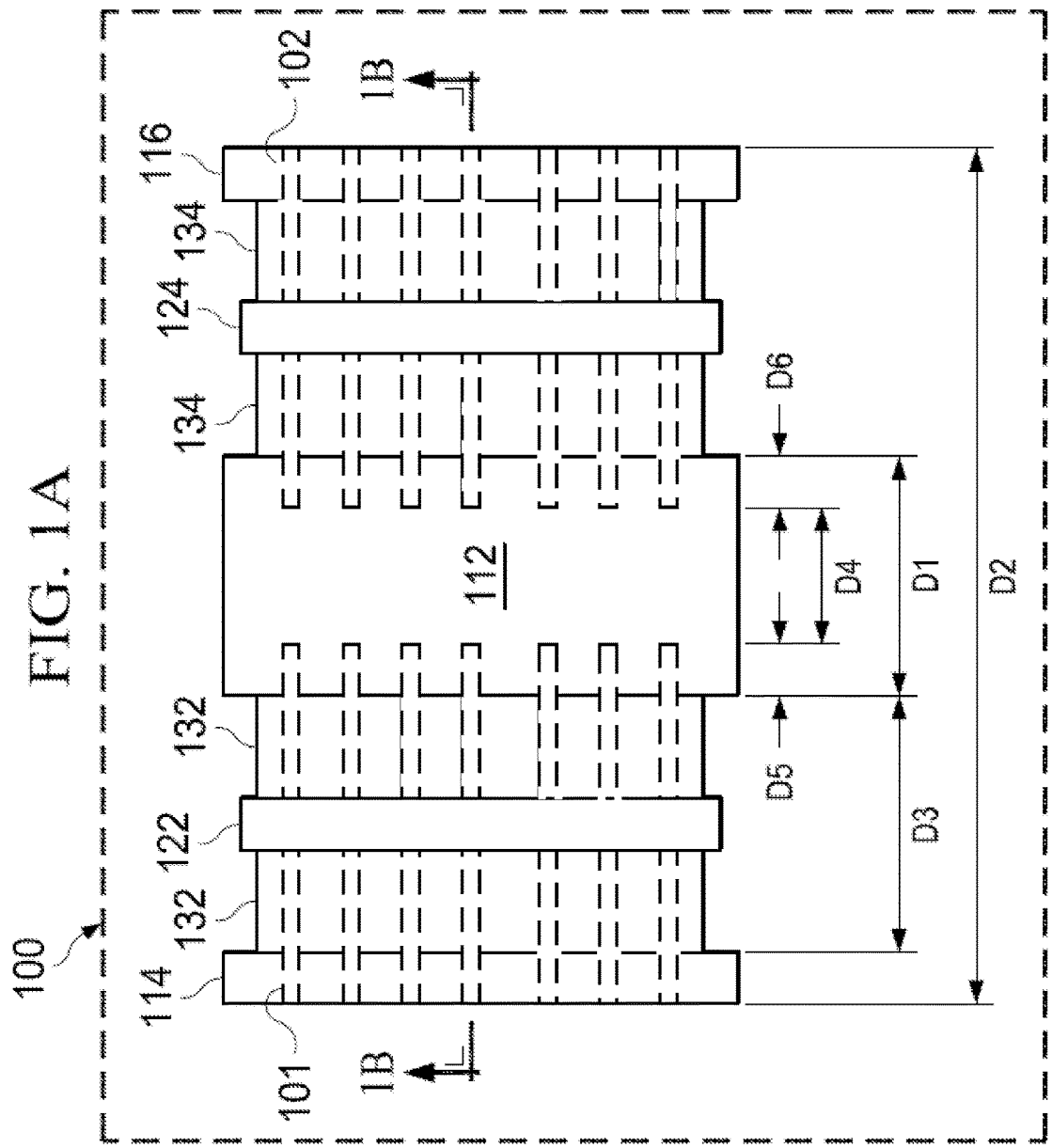
FIG. 1A illustrates a top view of an n-type ESD protection diode in accordance with various embodiments of the present disclosure.

FIG. 1A illustrates a top view of an n-type ESD protection diode in accordance with various embodiments of the present disclosure. The top view 100 shows there may be a plurality of first fins 101 and second fins 102 formed over a substrate 154 (not shown but in the cross sectional view). The first fins 101 as shown in FIG. 1A are arranged in parallel. Likewise, as shown in FIG. 1A, the second fins 102 are arranged in parallel. In addition, there may be a shallow trench isolation (STI) region 103 (shown in the cross sectional view) formed between the first fin 101 and the second fin 102. The dimension and location of the STI region 103 will be described below with respect to the cross sectional view 150. It should be noted that two adjacent first fins 101 or two adjacent second fins 102 may also be separated by STI regions (not shown).

In some embodiments, the first fins 101 and second fins 102 may be formed by recessing the top surfaces of STI regions (not shown), and hence allowing the first fins 101 and second fins 102 to protrude up from the surface of the substrate 154. In alternative embodiments, the first fins 101 and second fins 102 may be formed by an epitaxial growth process in which the first fins 101 and second fins 102 are grown from the semiconductor strips between STI regions (not shown).

In order to form an n-type ESD protection diode, an N+ region 132 and a P+ region 134 are formed in a p-well 152 (not shown but illustrated in the cross sectional view) through an epitaxial growth process. As shown in the top view 100, the N+ region 132 and the P+ region 134 are separated by an epitaxial grown (EPI) block region 112. The N+ region 132 and the P+ region 134 are connected to external circuits (not shown but illustrated in FIG. 6) through a first contact 122 and a second contact 124 respectively. Furthermore, there may be two EPI block regions 114 and 116 deposited adjacent to the N+ region 132 and the P+ region 134 respectively. The EPI block regions 114 and 116 are employed to isolate the ESD protection diode from adjacent active regions (not shown). In some embodiments, the EPI block regions 112, 114 and 116 may be formed of suitable dielectric materials including silicon nitride and/or the like.

In some embodiments, the n-type ESD protection diode shown in FIG. 1A is formed by the N+ region 132 and the P+ region 134. In other words, the P+ region 134 functions as an anode of the n-type ESD protection diode and the N+ region 132 functions as a cathode of the n-type ESD protection diode. When the n-type ESD protection diode operates a forward conduction mode, a current flows from the P+ region 134 to the N+ region 132. The ESD protection diode may act as a pull-up or a pull-down diode so that the voltage spike can be clamped to either a power source or ground. The detailed operation of the n-type ESD protection diode will be described below with respect to FIG. 7.

As shown in FIG. 1A, the n-type ESD protection diode is of a pitch D2 approximately equal to 524 nm according to some embodiments. The N+ region 132 is of width D3 approximately equal to 118 nm. The EPI block region 112 is of a width D1 approximately equal to 144 nm. The gap between the first fin 101 and the second fin 102 is defined as D4. In some embodiments, D4 is approximately equal to 66 nm. The length of the portion of the first fin 101 underneath the EPI block region 112 is defined as D5. The length of the portion of the second fin 102 underneath the EPI block region 112 is defined as D6. According to some embodiments, D5 and D6 are approximately equal to 39 nm.

It should be noted that the dimensions used herein are selected purely for demonstration purposes and are not intended to limit the various embodiments of the present disclosure to any particular size dimensions.

FIG. 1B illustrates a cross sectional view of the n-type ESD protection diode shown in FIG. 1A in accordance with various embodiments of the present disclosure. The cross sectional view 150 is taken along line A-A' of the top view 100. The cross section view 150 shows the N+ region 132 and the P+ region 134 are formed over a p-well 152. There may be a STI region 103 formed between the N+ region 132 and the P+ region 134. As is known in the art, the STI region 103 may be formed by etching the substrate 154 to from a recess, and then filling the recess with dielectric materials.

The p-well 152 is formed in a substrate 154. The substrate 154 may be formed of silicon, although it may also be formed of other group III, group IV, and/or group V elements, such as silicon, germanium, gallium, arsenic, and combinations thereof.

The substrate 154 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 154 may further comprise a variety of electrical circuits (not shown). The electrical circuits formed on the substrate 154 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Depending on different applications, the substrate 154 may be formed of either n-type dopants or p-type dopants. In accordance with an embodiment, the substrate 154 is a p-type substrate. The doping density of the substrate 154 is in a range from about $10^{14}/cm^3$ to about $10^{16}/cm^3$.

The fabrication steps of the N+ region 132 and the P+ region 134 may comprise forming an active region, or an oxide defined (OD) region such as the first fin 101 and the second fin 102 over the p-well 152, depositing an EPI growth block layer, patterning the EPI growth block layer to define the epitaxial growth regions, etching the epitaxial growth regions and growing the N+ region 132 and the P+ region 134 through an epitaxial process.

It should be noted that in a conventional fabrication process, instead of employing EPI growth block layers (e.g., EPI growth block layer 112), dummy poly regions are employed as a hard mask to define the epitaxial growth regions. In the present disclosure, as shown in the cross sectional view 150, EPI block regions 112, 114 and 116 are employed to define the EPI growth regions of the N+ region 132 and the P+ region 134.

The N+ region 132 may be formed by implanting appropriate n-type dopants such as phosphorous, arsenic and/or the like. The P+ region 134 may be formed by implanting appropriate p-type dopants such as boron, gallium, indium and/or the like. It should be noted that during the growth of the N+ regions 132 and the P+ region 134, the n-type dopants and the p-type dopants may be in-situ doped, and hence the resulting semiconductor regions (e.g., N+ region 132 and P+ region 134) may be of n-type or p-type.

One advantageous feature of having EPI block regions (e.g., EPI block regions 112, 114 and 116) between the N+ region 132 and the P+ region 134 is that the space between the anode and the cathode of the ESD protection diode shown in FIG. 1A and FIG. 1B is reduced in comparison with a conventional STI ESD protection diode. In some embodiments, in comparison with the conventional STI based ESD protection diodes, the size of the ESD diodes having EPI block regions is reduced by 35%.

Another advantageous feature of having EPI block regions shown in FIG. 1A and FIG. 1B is that the fabrication steps of the EPI block regions are a FinFET compatible process. In addition, the EPI block region 112 as well as the STI region 103 formed underneath the EPI block region 112 may help to improve the overdrive capability of the ESD protection diode. As a result, the voltage rating of the ESD protection diode may be improved. For example, the voltage rating of the ESD protection diode is improved from 1.8V to 5V.

Figure 2B:
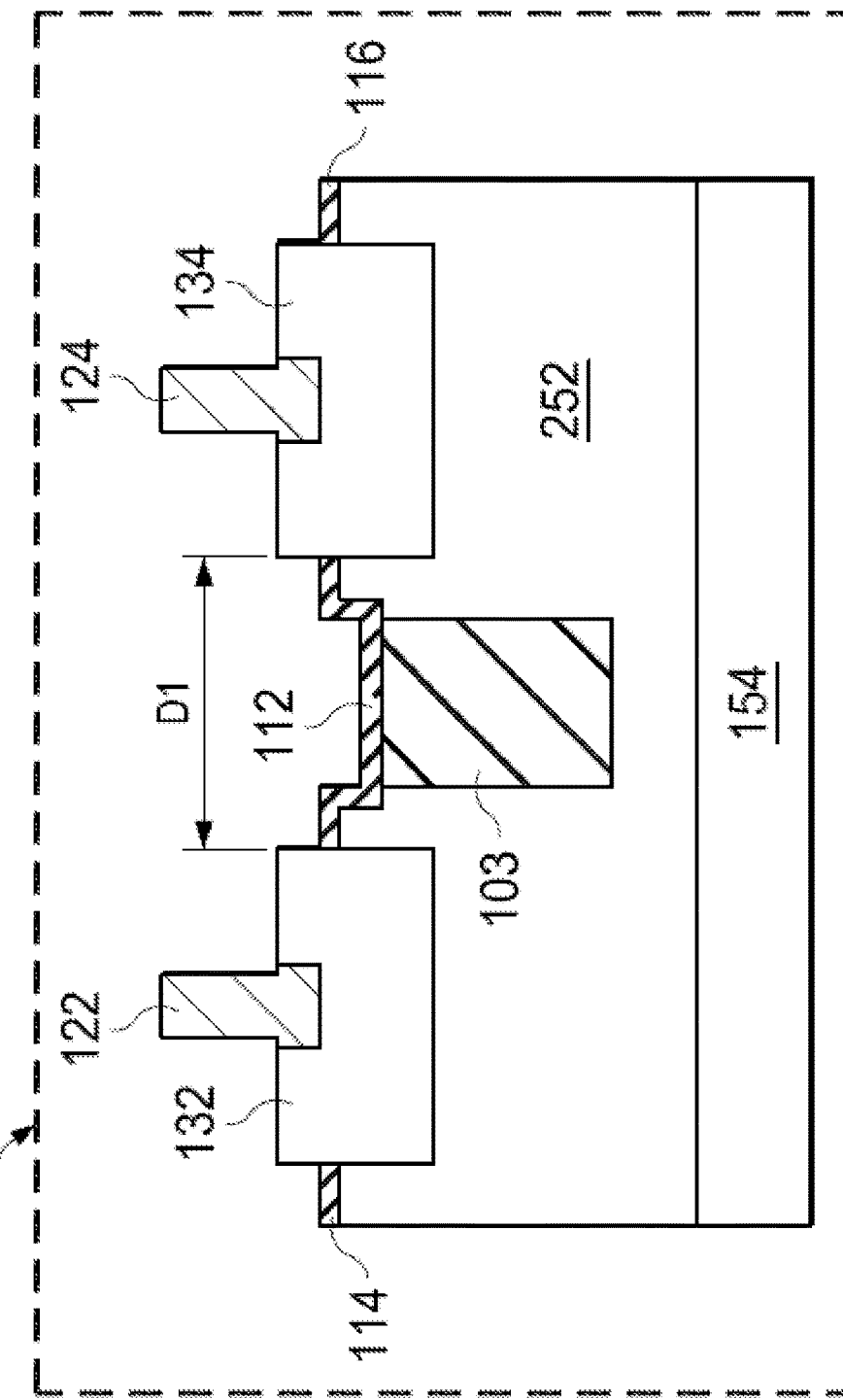
FIG. 2B illustrates a cross sectional view of the p-type ESD protection diode shown in FIG. 2A in accordance with various embodiments of the present disclosure.

FIG. 2A and FIG. 2B illustrates a top view and a cross sectional view of a p-type ESD protection diode in accordance with various embodiments of the present disclosure. The structure of the p-type ESD protection diode shown in FIG. 2A and FIG. 2B is similar to the n-type ESD protection diode shown in FIG. 1A and FIG. 1B except that the N+ region 132 and the P+ region 134 are grown in an n-well 252 through an epitaxial growth process. The detailed description of the structure of an ESD protection diode including EPI growth block regions has been discussed above with respect to FIG. 1A and FIG. 1B, and hence is not discussed herein again to avoid repetition.

Figure 3B:
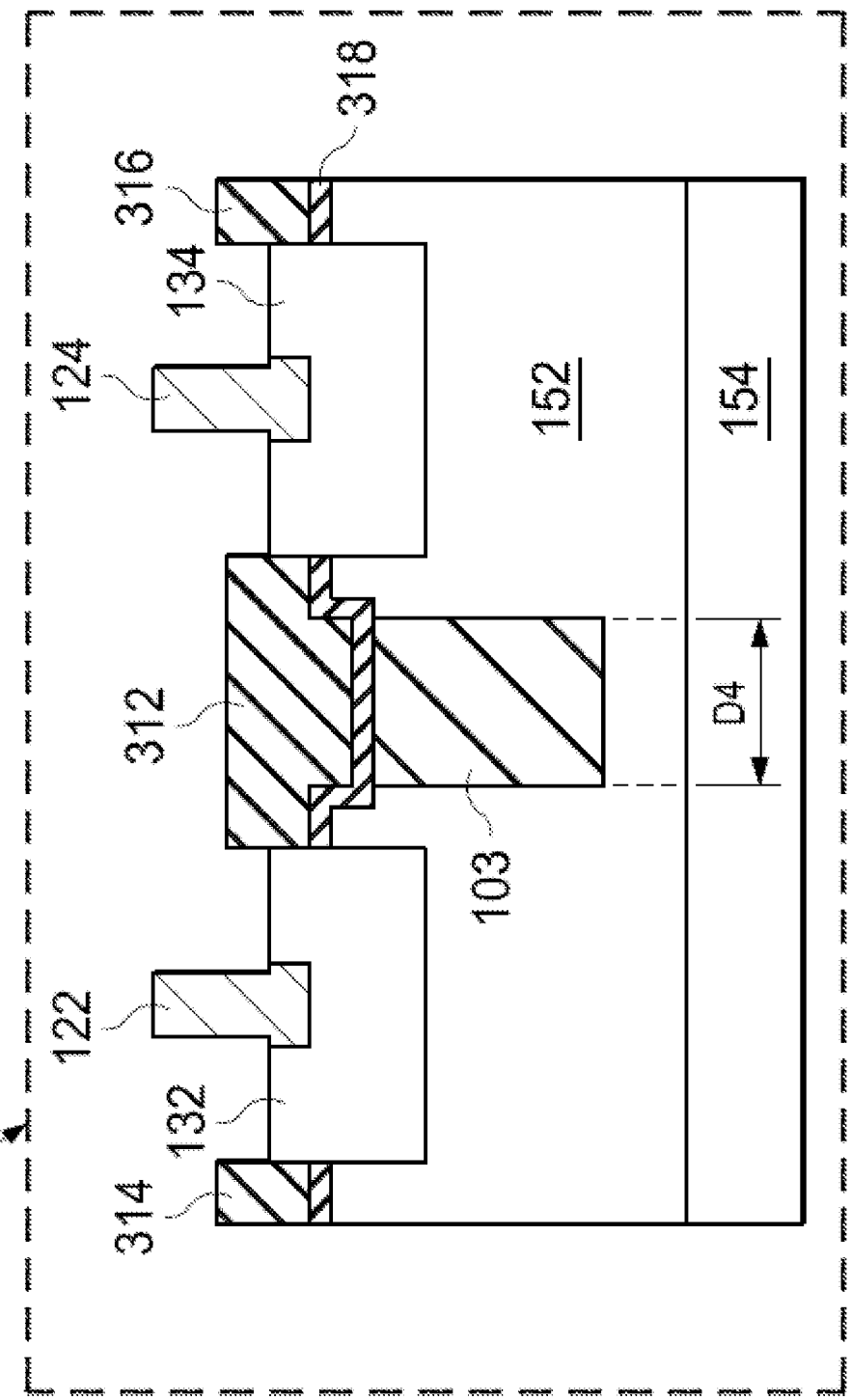
FIG. 3B illustrates a cross sectional view of the n-type ESD protection diode shown in FIG. 3A in accordance with various embodiments of the present disclosure.

FIG. 3A and FIG. 3B illustrates a top view and a cross sectional view of another n-type ESD protection diode in accordance with various embodiments of the present disclosure. The structure of the n-type ESD protection diode shown in FIG. 3A and FIG. 3B is similar to the n-type ESD protection diode shown in FIG. 1A and FIG. 1B except that the EPI block regions 112, 114 and 116 of FIG. 1A and FIG. 1B are replaced by dummy poly regions 312, 314 and 316 respectively. In addition, a gate dielectric layer 318 may be placed between a dummy poly region (e.g., dummy poly region 316) and the top surface of the p-well 152.

The dummy poly regions 312, 314 and 316 may be formed of the same material as a gate electrode (not shown). In some embodiments, the gate electrode may be formed of polycrystalline-silicon. The regions 312, 314 and 316 may function as hard masks rather than gate electrodes. Therefore, the regions 312, 314 and 316 are commonly known as dummy poly regions. The detailed description of the structure of the n-type ESD protection diode has been discussed above with respect to FIG. 1A and FIG. 1B, and hence is not discussed herein again to avoid repetition.

It should be noted that the layout of the dummy poly regions is different from a conventional STI ESD protection diode having dummy poly regions as hard masks. For example, in a conventional STI ESD protection diode, the dummy poly region 312 may be replaced by two separate dummy poly regions (not shown). There may be a spacing requirement (e.g., a spacing gap) between these two separate dummy poly regions. In some embodiments, the spacing gap may be about 118 nm to comply the design guidelines of dummy poly regions. In contrast, the dummy poly region 312 shown in FIG. 3A and FIG. 3B is a single dummy poly region. By merging two separate dummy poly regions into a single dummy poly region as shown in FIG. 3A and FIG. 3B, the spacing between the N+ region 132 and the P+ region 134 can be reduced.

In some embodiments, the n-type ESD protection diode shown in FIG. 3A and FIG. 3B is of a pitch D2 approximately equal to 524 nm. The N+ region 132 is of width D3 approximately equal to 118 nm. The dummy poly region 312 is of a width D1 approximately equal to 136 nm. The STI region 103 is of a width approximately equal to 66 nm. It should be noted that the width of STI region 103 is equal to the gap between the first fin 101 and the second fin 102, which is defined as D4 in the top view 300. It should further be noted that the dimensions used herein are selected purely for demonstration purposes and are not intended to limit the various embodiments of the present disclosure to any particular size dimensions.

Figure 4B:
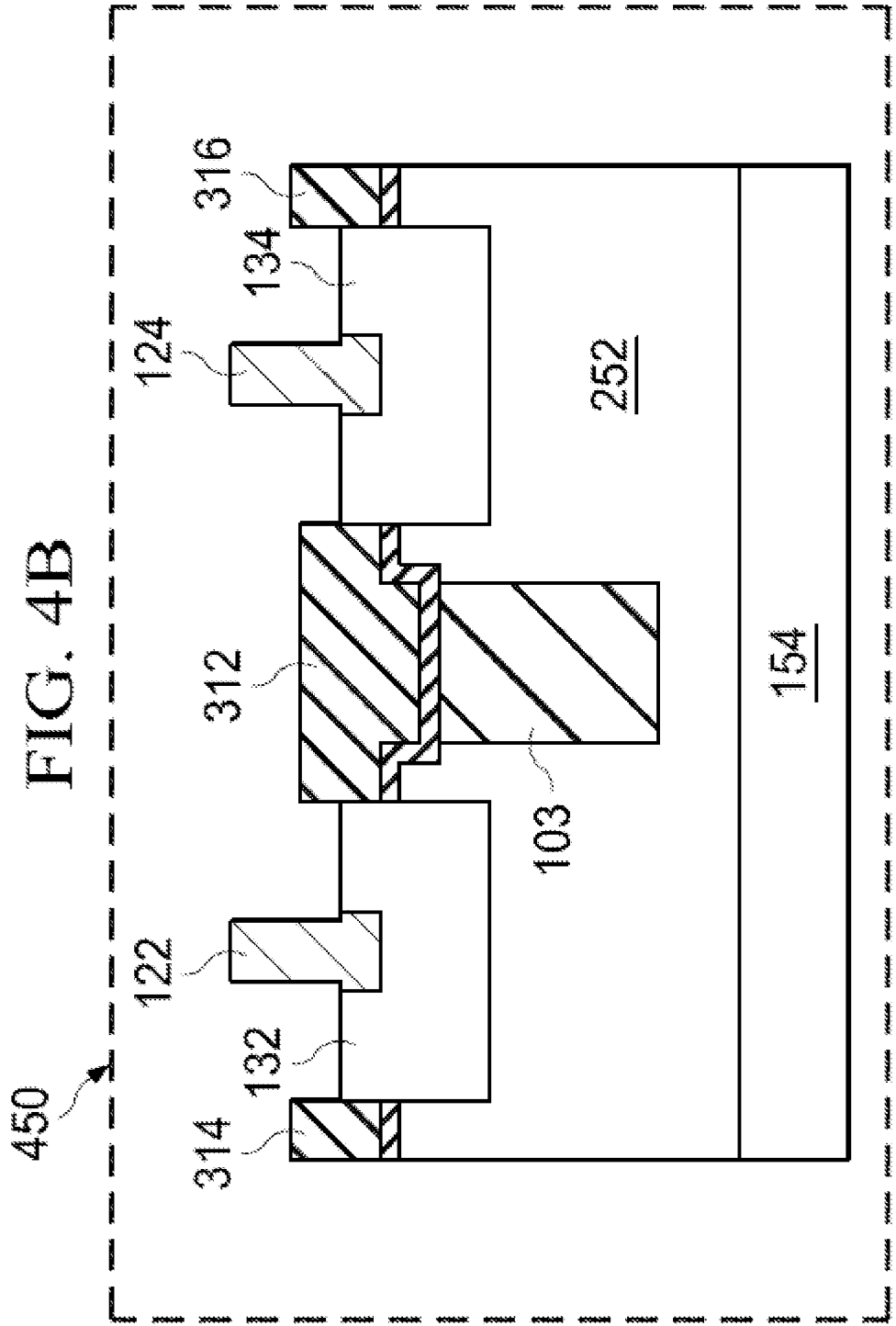
FIG. 4B illustrates a cross sectional view of the p-type ESD protection diode shown in FIG. 4A in accordance with various embodiments of the present disclosure.

FIG. 4A and FIG. 4B illustrates a top view and a cross sectional view of another p-type ESD protection diode in accordance with various embodiments of the present disclosure. The structure of the p-type ESD protection diode shown in FIG. 4A and FIG. 4B is similar to the n-type ESD protection diode shown in FIG. 3A and FIG. 3B except that the N+ region 132 and the P+ region 134 are grown in an n-well 252 through an epitaxial growth process.

Figure 5:
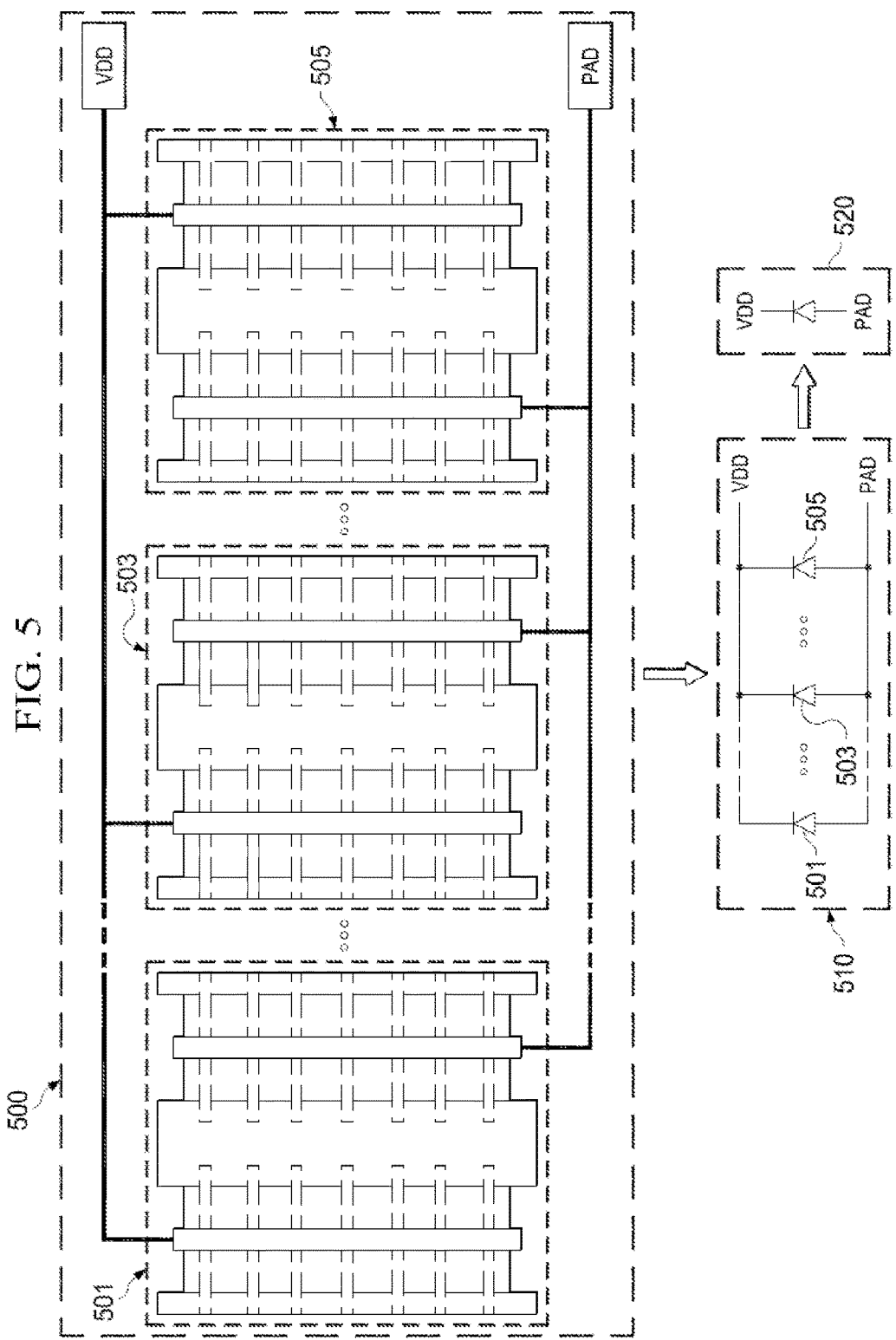
FIG. 5 illustrates a plurality of p-type ESD protection diodes coupled between a voltage rail and an input/output terminal of an integrated circuit in accordance with various embodiments of the present disclosure.

FIG. 5 illustrates a plurality of p-type ESD protection diodes coupled between a voltage rail and an input/output terminal of an integrated circuit in accordance with various embodiments of the present disclosure. A plurality of p-type ESD protection diodes (e.g., ESD protection diodes 501, 503 and 505) are coupled between a power source rail VDD and an input/output terminal PAD. As shown in FIG. 5, p-type ESD protection diodes 501, 503 and 505 are connected in parallel. Each p-type ESD protection diode (e.g., ESD protection diode 501) may be of the same structure as the p-type ESD protection diode shown in FIG. 2A and FIG. 2B, and hence is not discussed herein. It should be noted that the leftmost EPI block region of the ESD protection diode 501 and the rightmost EPI block region of the ESD protection diode 505 may be replaced by dummy poly regions (not shown).

FIG. 5 further illustrates an equivalent circuit 510. The equivalent circuit 510 may comprise a plurality of p-type ESD protection diodes 501, 503 and 505 connected in parallel between the power source rail VDD and the input/output terminal PAD. More particularly, the anodes of the p-type ESD protection diodes 501, 503 and 505 are connected to the input/output terminal PAD. The cathodes of the p-type ESD protection diodes 501, 503 and 505 are connected to the power source rail VDD. For simplicity, the plurality of p-type ESD protection diodes 501, 503 and 505 can be replaced by a single p-type ESD protection diode 520 as shown in FIG. 5.

Figure 6:
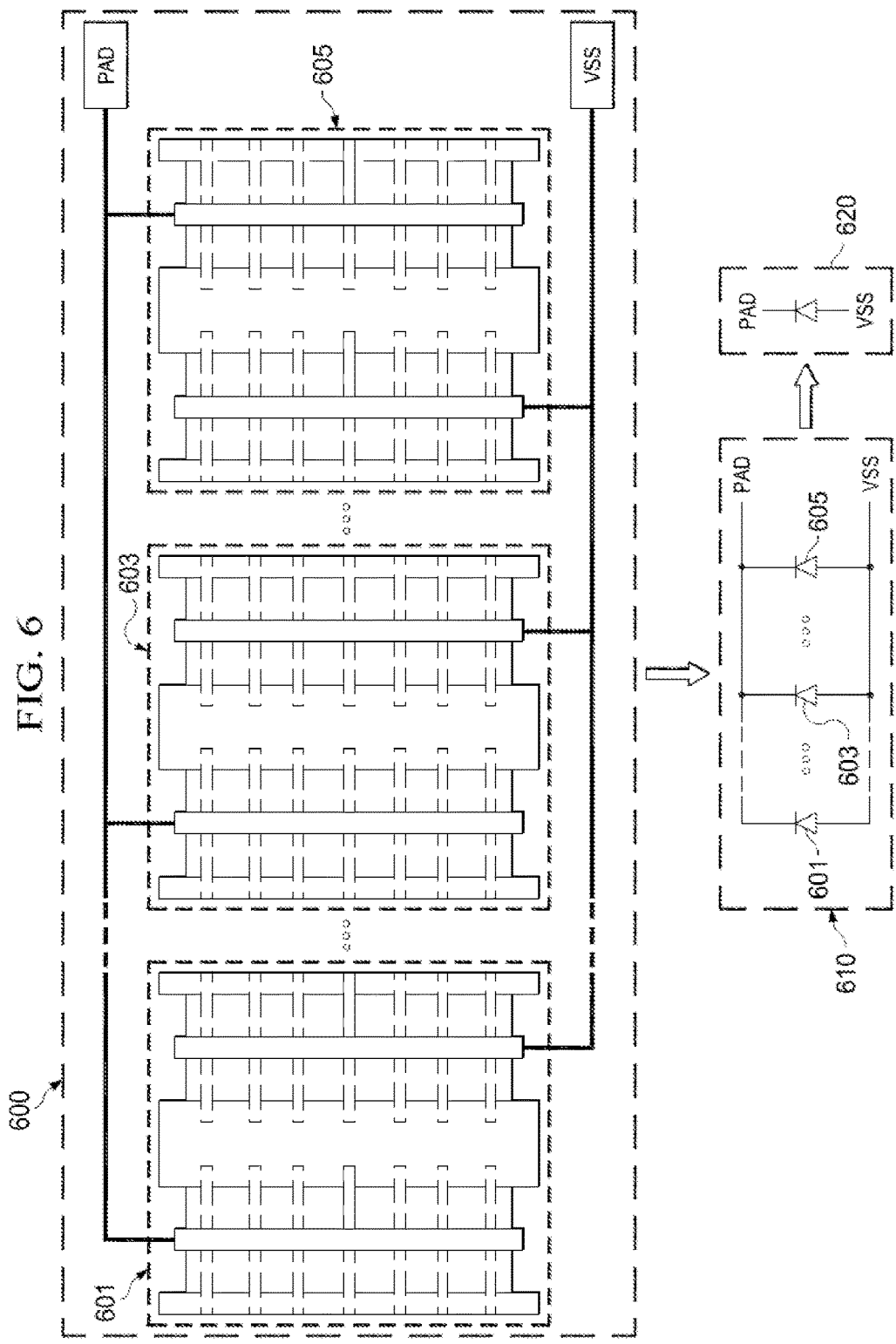
FIG. 6 illustrates a plurality of n-type ESD protection diodes coupled between a voltage rail and an input/output terminal of an integrated circuit in accordance with various embodiments of the present disclosure.

FIG. 6 illustrates a plurality of n-type ESD protection diodes coupled between a voltage rail and an input/output terminal of an integrated circuit in accordance with various embodiments of the present disclosure. The configuration of the n-type ESD protection diodes 601, 603 and 605 is similar to that of the p-type ESD protection diodes shown in FIG. 5 except that the anodes of the n-type ESD protection diodes 601, 603 and 605 are connected to ground VSS. The cathodes of the n-type ESD protection diodes 601, 603 and 605 are connected to the input/output terminal PAD.

The plurality of n-type ESD protection diodes 601, 603 and 605 can be replaced by a single n-type ESD protection diode 620 as shown in FIG. 6. The detailed description of the configuration of the ESD protection diodes has been discussed above with respect to FIG. 5, and hence is not discussed herein again to avoid repetition.

Figure 7:
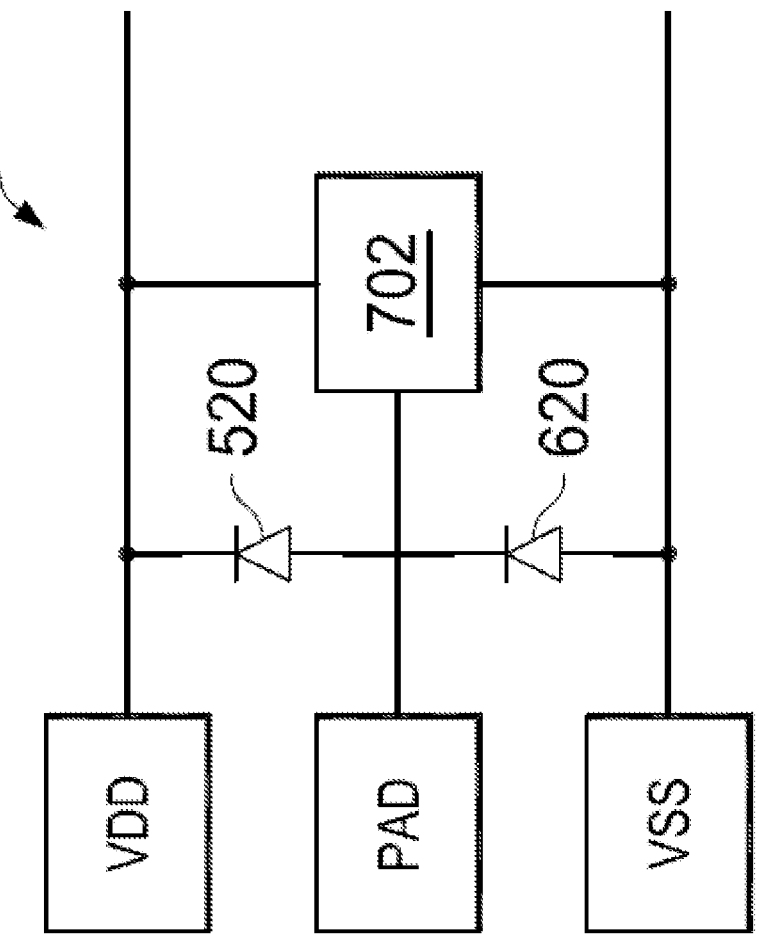
FIG. 7 illustrates an integrated circuit level ESD protection diagram.

FIG. 7 illustrates an integrated circuit level ESD protection diagram in accordance with various embodiments of the present disclosure. An integrated circuit chip 700 has a VDD pad, an input/output terminal PAD and a VSS pad. Internal circuits 702 are coupled to the VDD pad and the VSS pad. The internal circuits 702 further include an input coupled to the input/output terminal PAD. A first ESD protection diode 520 is coupled between the input/output terminal PAD and the VDD pad. A second ESD protection diode 620 is coupled between the input/output terminal PAD and the VSS pad.

It should be noted that the configuration of the ESD protection diodes 520 and 620 is provided for illustrative purpose only. One skilled in the art will recognize that other configurations for an ESD protection device, including differing numbers of ESD protection diodes and a plurality of ESD protection diodes connected in series or in parallel, can be employed.

The ESD protection diodes 520 and 620 form a clamping circuit to protect the internal circuits 702 during an ESD transient. For example, during normal operation, the input/output terminal is of a voltage higher than the voltage of the VSS pad. Similarly, the voltage of the input/output terminal is lower than the voltage of the VDD pad. When an ESD event occurs at the input/output terminal, the ESD protection diodes 520 and 620 are able to clamp the voltage of the input/output terminal to either the voltage of the VDD pad or the voltage of the VSS pad.

When a positive voltage spike occurs at the input/output terminal, the ESD protection diode 520 is forward-biased because the voltage at the anode is higher than the voltage at the cathode of the ESD protection diode 520. As a result, the ESD protection diode 520 conducts the ESD current, and the forward-biased ESD protection diode 520 clamps the voltage of the input/output terminal below the maximum voltage to which the internal circuits 702 are specified, so that the internal circuits 502 coupled to the input/output terminal are protected.

When a negative voltage spike occurs at the input/output terminal, the ESD protection diode 620 is forward-biased because the voltage at the anode is higher than the voltage at the cathode of the ESD protection diode 620. As a result, the ESD protection diode 620 conducts the ESD current, and the forward-biased ESD protection diode 620 clamps the voltage of the input/output terminal below the maximum voltage to which the internal circuits 702 are specified, so that the internal circuits 702 coupled to the input/output terminal are protected.

The connection of the ESD protection diodes 520 and 620 in FIG. 7 is merely an example, which should not unduly limit the scope of the claims. One skilled in the art will recognize many variations, alternatives, and modifications. For example, while FIG. 7 illustrates two ESD protection diodes 520 and 620 connected in series between the VDD pad and the VSS pad, the ESD protection circuit could accommodate any numbers of ESD protection diodes.

It is understood that the ESD protection circuit may be implemented using a plurality of ESD protection diodes in series connection. On the other hand, other configurations of a plurality of ESD protection diodes such as parallel-connected ESD protection diodes coupled to parallel-connected ESD protection diodes are also within the contemplated scope of various embodiments of the present disclosure.

Figure 8:
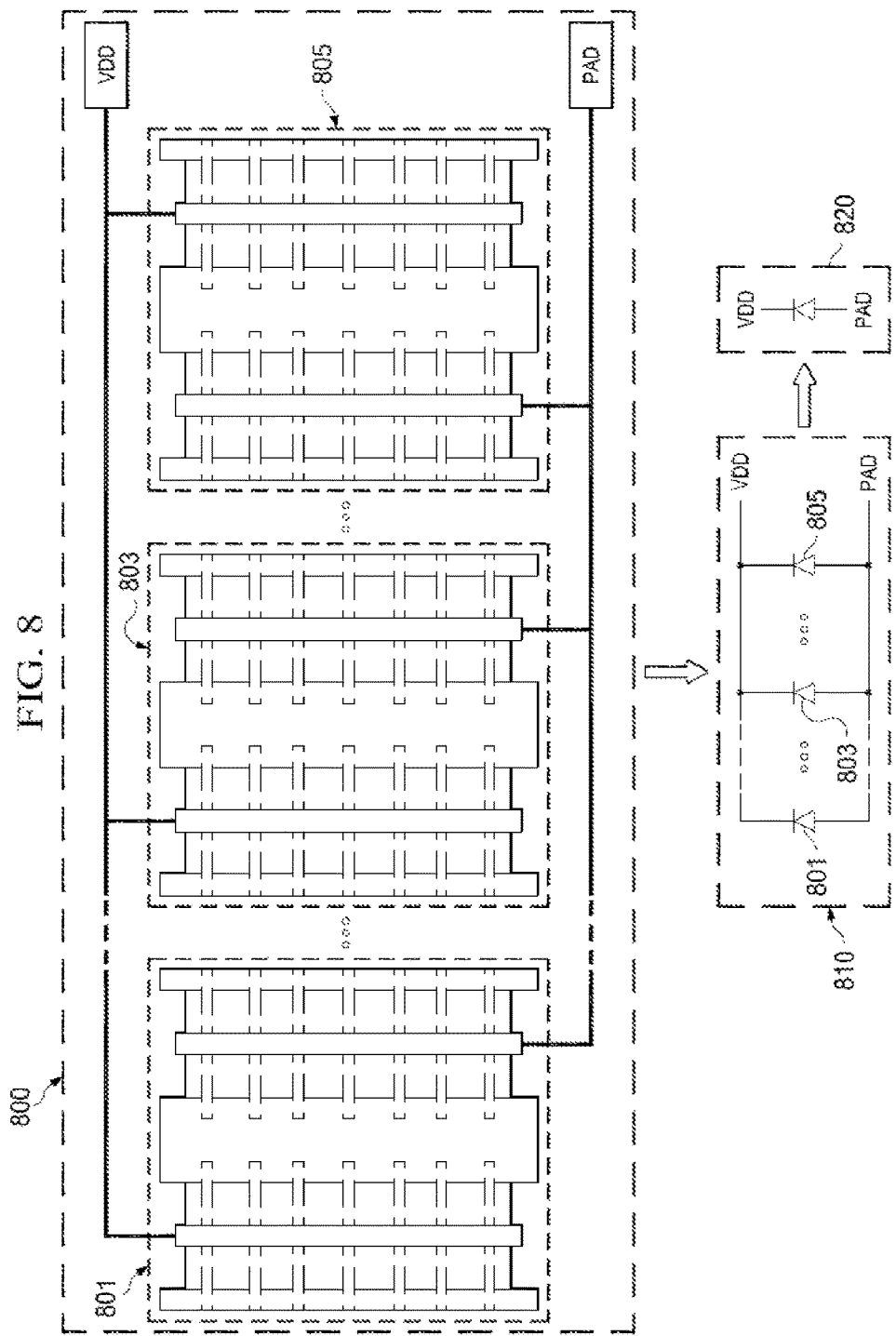
FIGS. 8-10 illustrate a plurality of p-type ESD protection diodes connected in parallel, a plurality of n-type ESD protection diodes connected in parallel and an integrated circuit level ESD protection diagram in according with various embodiments of the present disclosure.
Figure 9:
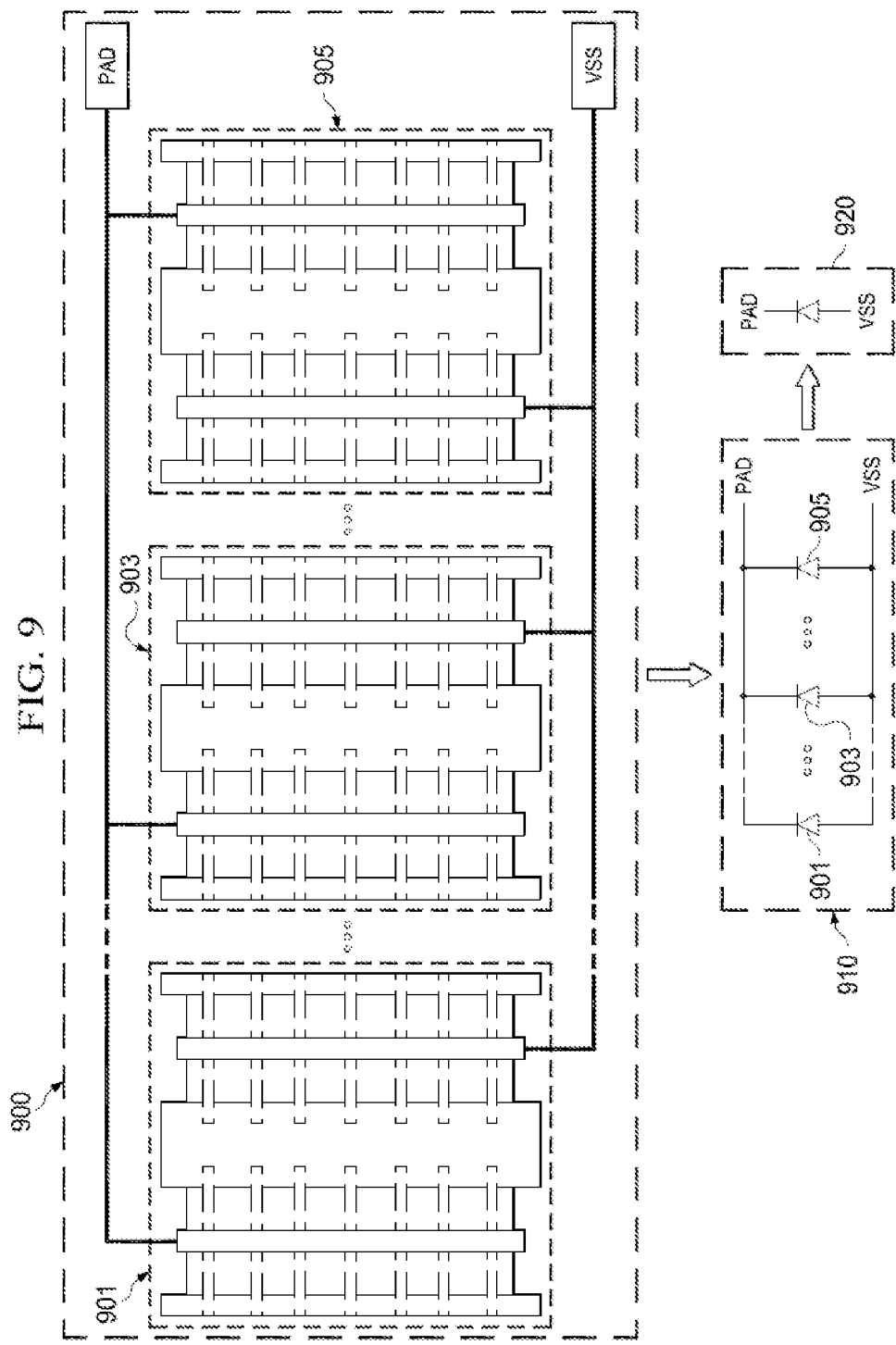
Figure 10:
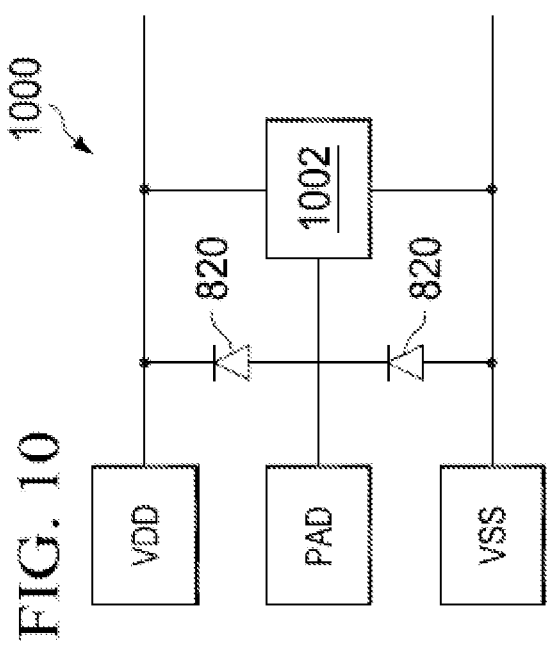

FIGS. 8-10 illustrate a plurality of p-type ESD protection diodes connected in parallel, a plurality of n-type ESD protection diodes connected in parallel and an integrated circuit level ESD protection diagram in according with various embodiments of the present disclosure. The detailed operation principle of the ESD protection structure shown in FIGS. 8-10 are similar to that shown in FIGS. 5-7 except that the p-type ESD protection diodes shown in FIG. 8 are based upon the ESD protection diode having a single dummy poly region 312 shown in FIG. 4A and FIG. 4B. Likewise, the n-type ESD protection diodes shown in FIG. 9 are based upon the ESD protection diode having a single dummy poly region 312 shown in FIG. 3A and FIG. 3B. ESD protection diodes having a single dummy poly region between the N+ region and the P+ region have been described above with respect to FIG. 3A, FIG. 3B, FIG. 4A and FIG. 4B, and hence are not discussed again herein.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming an active region including a first fin and a second fin, wherein the first fin and the second fin are separated by a shallow trench isolation region;
depositing an epitaxial growth block layer over the active region;
patterning the epitaxial growth block layer to define a first growth area for an N+ region and a second growth area for a P+ region;
removing portions of the active region in the first growth area and the second growth area; and
growing the N+ region and the P+ region through an epitaxial growth process, wherein the N+ region and the P+ region form an electrostatic discharge (ESD) protection diode.

2. The method of claim 1, wherein:
the N+ region is formed over a p-well of a substrate; and
the P+ region is formed over the p-well of the substrate, and wherein the N+ region and the P+ region form an n-type ESD protection diode.

3. The method of claim 1, wherein:
the epitaxial growth block layer comprises silicon nitride.

4. The method of claim 1, wherein:
the N+ region is formed over an n-well of a substrate; and
the P+ region is formed over the n-well of the substrate, and wherein the N+ region and the P+ region form a p-type ESD protection diode.

5. The method of claim 1, wherein:
the epitaxial growth block layer is a dummy poly layer.

6. A method comprising:
forming a first fin and a second fin over a well of a substrate;
forming an isolation region between the first fin and the second fin;
depositing an epitaxial growth block layer over the well;
patterning the epitaxial growth block layer to define a first growth area and a second growth area, wherein a top surface of the epitaxial growth block layer over the well is higher than a top surface of the epitaxial growth block layer over the isolation region; and
growing an N+ region in the first growth area and a P+ region in the second growth area.

7. The method of claim 6, wherein:
the isolation region is a shallow trench isolation region; and
the well is a p-type well.

8. The method of claim 6, wherein:
the epitaxial growth block layer is a silicon nitride layer.

9. The method of claim 6, wherein:
the isolation region is a shallow trench isolation region; and
the well is an n-type well.

10. The method of claim 6, further comprising:
depositing a gate dielectric layer underneath the epitaxial growth block layer.

11. The method of claim 10, wherein:
the epitaxial growth block layer is a dummy poly layer.

12. The method of claim 11, wherein:
the N+ region and the P+ region are separated by the dummy poly layer.

13. A method comprising:
forming an active region including a first fin and a second fin over a substrate, wherein the first fin and the second fin are separated by an isolation region;
depositing an epitaxial growth block layer over the active region;
patterning the epitaxial growth block layer to define a first growth area and a second growth area; and
growing an N+ region in the first growth area and a P+ region in the second growth area.

14. The method of claim 13, further comprising:
prior to the step of growing the N+ region in the first growth area and the P+ region in the second growth area, removing portions of the active region in the first growth area and the second growth area.

15. The method of claim 13, further comprising:
growing the N+ region and the P+ region through an epitaxial growth process.

16. The method of claim 13, wherein:
the N+ region and the P+ region form an electrostatic discharge (ESD) protection diode.

17. The method of claim 13, wherein:
the epitaxial growth block layer is a silicon nitride layer.

18. The method of claim 17, wherein:
the N+ region and the P+ region are separated by the silicon nitride layer.

19. The method of claim 13, wherein:
the epitaxial growth block layer is a dummy poly layer.

20. The method of claim 19, wherein:
the N+ region and the P+ region are separated by the dummy poly layer.

* * * * *